(12) United States Patent
Matsuura et al.

(10) Patent No.: US 8,297,429 B2
(45) Date of Patent: Oct. 30, 2012

(54) METHOD OF POSITIONING CONVEYANCE SECTION, AND CONVEYANCE DEVICE

(75) Inventors: Masanari Matsuura, Chiryu (JP);
Sotaro Ol, Saitama (JP); Tomoyuki Kubota, Yatsushiro (JP); Masaya Tsuruta, Kumamoto (JP)

(73) Assignees: Toyota Jidosha Kabushiki Kaisha, Toyota (JP); Hirata Corporation, Tokyo (JP)

( * ) Notice: Subject to any disclaimer, the term of this patent is extended or adjusted under 35 U.S.C. 154(b) by 595 days.

(21) Appl. No.: 12/449,870

(22) PCT Filed: Nov. 5, 2008

(86) PCT No.: PCT/JP2008/070071
§ 371 (c)(1),
(2), (4) Date: Sep. 1, 2009

(87) PCT Pub. No.: WO2009/060842
PCT Pub. Date: May 14, 2009

(65) Prior Publication Data
US 2010/0089720 A1    Apr. 15, 2010

(30) Foreign Application Priority Data

Nov. 5, 2007  (JP) .................................. 2007-287406
Jan. 11, 2008 (JP) .................................. 2008-004601
Feb. 28, 2008 (JP) .................................. 2008-048113

(51) Int. Cl.
*B65G 47/26* (2006.01)
(52) U.S. Cl. .................................................. 198/345.3
(58) Field of Classification Search ................ 198/345.3
See application file for complete search history.

(56) References Cited

U.S. PATENT DOCUMENTS

| | | | |
|---|---|---|---|
| 2,295,732 A * | 9/1942 | Hess | 34/86 |
| 2,367,093 A * | 1/1945 | Brown, Jr. et al. | 264/44 |
| 3,814,232 A | 6/1974 | Eriksson | |
| 5,695,667 A | 12/1997 | Eguchi et al. | |
| 2005/0139450 A1 | 6/2005 | Behnke et al. | |

FOREIGN PATENT DOCUMENTS

| | | |
|---|---|---|
| DE | 22 61 463 A1 | 6/1973 |
| DE | 42 36 534 A1 | 5/1994 |
| DE | 10 2006 028 493 A1 | 12/2007 |
| JP | U 52-119580 | 9/1977 |
| JP | Y2 1-15199 | 5/1989 |
| JP | A 7-81730 | 3/1995 |
| JP | A 8-206825 | 8/1996 |
| JP | A 9-126660 | 5/1997 |
| JP | A 2002-35920 | 2/2002 |
| JP | 3524243 B2 | 5/2004 |
| WO | WO 2008/139089 A1 | 11/2008 |

OTHER PUBLICATIONS

German Office Action issued in German Application No. 11 2008 00 599.0 dated May 10, 2011 (with translation p. 2-4).

* cited by examiner

*Primary Examiner* — David S Blum
(74) *Attorney, Agent, or Firm* — Oliff & Berridge, PLC

(57) ABSTRACT

A conveyance section positioning method has carrier pallets on which workpieces are fixed, a conveyer, a heating furnace for heating the workpieces, and a positioning mechanism for positioning the carrier pallets, and the method stops the carrier pallets at predetermined positions. The heating furnace has halogen heaters for heating the workpieces. The carrier pallets each have projections and output grooves. Comb tooth-shaped stopper projections engaging with the projections are formed on a carrier stopper. When the carrier stopper is moved forward, the stopper projections and the projections are engaged with each other. In this one operation, the carrier pallets are positioned at places corresponding to the halogen heaters, and then the workpieces are heated.

10 Claims, 12 Drawing Sheets

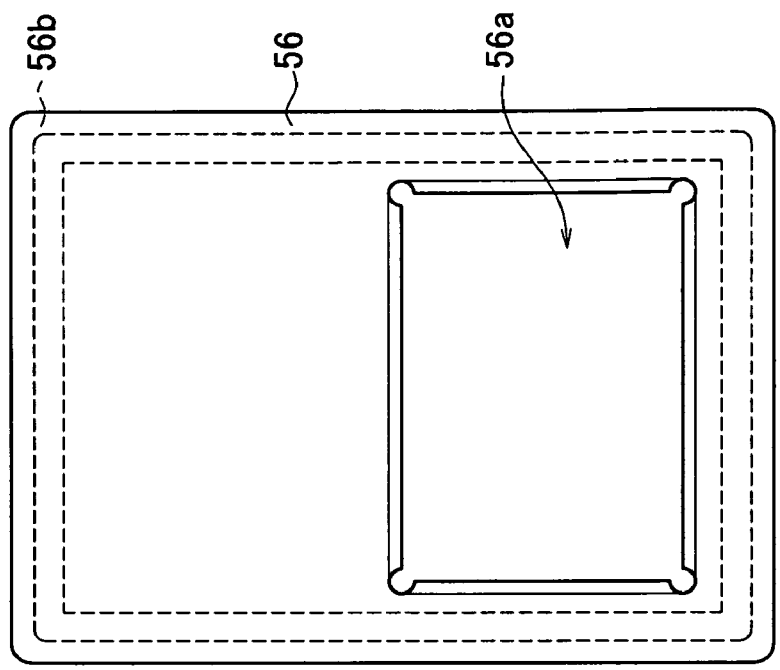
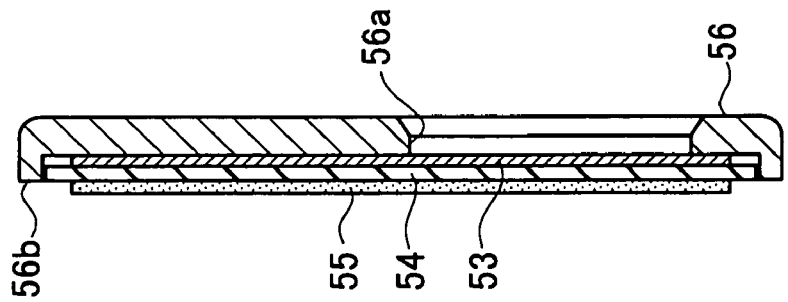

METHOD OF POSITIONING CONVEYANCE SECTION, AND CONVEYANCE DEVICE

TECHNICAL FIELD

The present invention relates to a technique for positioning a carrier conveyed by a conveyer into a heating furnace.

BACKGROUND ART

Various methods have been proposed for techniques for positioning a workpiece or carrier on a conveyer. For instance, the techniques disclosed in Patent Literatures 1 to 3 have been placed open to public inspection.

Patent Literature 1 discloses a technique related to a positioning mechanism for a component to be conveyed. Claw fittings for conveying substrates are moved in a conveying direction to move substrates as workpieces. Accordingly, each substrate can be held in a predetermined position by a positioning mechanism located in a foremost position. The positioning mechanism located in the foremost position performs positioning of the substrate by use of a block including a push block and a roller for guiding the substrate to the leading end of a cylinder.

With this configuration, a foremost substrate can be positioned in a predetermined position.

Patent Literature 2 discloses a technique for a solder ball mounting device and mounting method. In this technique, four cylinders serving as stoppers are arranged at fixed intervals to position substrates to be conveyed by a conveyer. Each cylinder rod is moved upward to protrude, thereby positioning each substrate.

The cylinders need to be provided one for every substrate and fixed to the conveyer.

Patent Literature 3 discloses a technique for mounting an insert cylindrical body. A plurality of rollers is used to convey the insert cylindrical body held in a standing position. A stopper protruding at a predetermined position in a direction perpendicular to a conveying direction of the insert cylindrical body is rotated by a drive mechanism to protrude into a conveyance section of the insert cylindrical body for positioning of the insert cylindrical body.

CITATION LIST

Patent Literature

Patent Literature 1: JP 1(1989))-15199 Y2
Patent Literature 2: JP 8(1996)-206825 A
Patent Literature 3: JP2002-35920 A

SUMMARY OF INVENTION

Technical Problem

However, adopting the techniques disclosed in Patent Literatures 1 to 3 for positioning in a heating furnace may cause some problems mentioned below.

In the case where the carrier needs to be conveyed into the heating furnace and positioned in the furnace with high positioning accuracy, it is necessary to take into account an influence of thermal expansion of the carrier.

Both techniques, Patent Literatures 1 and 3, are also to position workpieces on a conveyer by only a foremost workpiece conveyed by being pushed by following workpieces. Thus, even though the position of only the foremost workpiece is determined, the positions of following workpieces are determined loosely.

When the carriers each conveying workpieces are positioned in the heating furnace by the above methods, errors of stop positions would be accumulated as the number of carriers is increased. In particular, in the case where long carriers in the conveying direction are used or the internal temperature of the heating furnace is high, such errors tend to be larger.

On the other hand, the configuration disclosed in Patent Literature 2 including a plurality of stoppers is effective. In this case, however, drive mechanisms for driving the stoppers are required by the number corresponding to the workpieces. This does not contribute to cost reduction and the heating furnace internally needs the space for the drive mechanisms. Furthermore, the mechanisms are complicated, resulting in poor maintainability.

The present invention has been made to solve the above problems and has a purpose to provide a method of positioning conveyance section and a conveyance device with a simple mechanism for positioning a workpiece or a carrier in a heating furnace to heat the workpiece.

Solution to Problem

To achieve the above purpose, the conveyance section positioning method of the invention provides the following features.

(1) A method of positioning a conveyance section comprises carriers for mounting workpieces, a conveyer for conveying the carriers, a heating furnace for heating the workpieces while covering a part of the conveyer, and a positioning mechanism for positioning the carriers in the heating furnace, the method comprising positioning the carriers conveyed by the conveyer in predetermined places by the positioning mechanism to heat the workpieces, wherein the heating furnace includes heating devices for heating the workpieces are arranged at predetermined intervals, each of the carriers is provided with an engagement part, the positioning mechanism includes a plurality of positioning projections formed in a comb tooth-shape engageable with the engagement parts, and the positioning projections of the positioning mechanism are moved forward to engage with the engagement parts to position the carriers at a time in positions facing to the heating devices respectively.

(2) In the conveyance section positioning method set forth in (1), preferably, each of the engagement parts of the carriers is a cutout groove formed in parallel with a conveying direction of the carriers, the cutout groove being wider than a width of each positioning projection, and when each positioning projection is inserted in a front area of each cutout groove and the conveyer is moved forward to convey the carriers, each positioning projection is engaged in a rear end of each cutout groove.

To achieve the above purpose, furthermore, the conveyance device of the invention provides the following features.

(3) A conveyance device comprises carriers for mounting workpieces, a conveyer for conveying the carriers, a heating furnace for heating the workpieces while covering a part of the conveyer, and a positioning mechanism for positioning the carriers in the heating furnace, wherein a plurality of heating devices are arranged at predetermined intervals in the heating furnace, each of the carriers includes at least one engagement part, the positioning mechanism comprises a carrier stopper having comb tooth-shaped positioning projections engageable with the engagement parts of the carriers; and a reciprocating mechanism for moving the carrier stopper back and forth with respect to the carriers and engaging the positioning projections with the engagement parts of the carriers.

(4) Preferably, the conveyance section device set forth in (3) further comprises a detection sensor for detecting oncoming of the carriers, and a control means for controlling driving of the reciprocating mechanism based on a detection information by the detection sensor.

(5) In the conveyance section device set forth in (3) or (4), preferably, each carrier includes the engagement parts at a front end and a rear end in the conveying direction of the carrier.

(6) In one of the conveyance section devices set forth in (3) to (5), preferably, the engagement parts of each carrier are cutout grooves formed in parallel with the carrier conveying direction, each of the cutout grooves is formed wider than a width of each positioning projection, and when each positioning protrusion is inserted in a front area of each cutout groove, the conveyer is moved forward to convey the carriers, the positioning projections are engaged in a rear end of each cutout groove.

ADVANTAGEOUS EFFECTS OF INVENTION

The conveyance section positioning method of the invention providing the above features can provide the following operations and effects.

The invention described in (1) is a method of positioning a conveyance section comprising carriers for mounting workpieces, a conveyer for conveying the carriers, a heating furnace for heating the workpieces while covering a part of the conveyer, and a positioning mechanism for positioning the carriers in the heating furnace, the method comprising positioning the carriers conveyed by the conveyer in predetermined places by the positioning mechanism to heat the workpieces, wherein the heating furnace includes heating devices for heating the workpieces are arranged at predetermined intervals, each of the carriers is provided with an engagement part, the positioning mechanism includes a plurality of positioning projections formed in a comb tooth-shape engageable with the engagement parts, and the positioning projections of the positioning mechanism are moved forward to engage with the engagement parts to position the carriers at a time in positions facing to the heating devices respectively.

Accordingly, since the positioning projection is moved forward toward the engagement part of the carrier, the plurality of carriers in the heating furnace can be positioned at a time.

The plurality of comb tooth-shaped positioning projections are positioned in engagement with the engagement parts of the carriers respectively. Errors of stop positions are not accumulated accordingly.

Furthermore, the intervals between the positioning projections are determined to be wider than the width of each carrier in a conveying direction. Thus, the carriers do not interfere with each other during stop.

In the case where a plurality of workpieces is to be heated simultaneously at plural places, respective stop positions of the carriers mounting the workpieces tend to deviate. If errors of the stop positions are accumulated, the workpiece mounted on the subsequent carrier in the conveying direction also deviates from the heating device, so that an initially desired portion may not be heated. However, when the carriers are stopped by the corresponding positioning projections respectively, the error accumulation can be prevented.

Moreover, one or a pair of positioning mechanisms is used to position a plurality of carriers, contributing to a cost reduction.

The invention described in (2) is that, in the conveyance section positioning method (1), each of the engagement parts of the carriers is a cutout groove formed in parallel with a conveying direction of the carriers, the cutout groove being wider than a width of each positioning projection, and when each positioning projection is inserted in a front area of each cutout groove and the conveyer is moved forward to convey the carriers, each positioning projection is engaged in a rear end of each cutout groove.

Accordingly, since the cutout groove formed as the engagement part in the carrier is designed to be wider than the width of positioning projection, positioning of the carrier by the positioning projection can be facilitated.

Furthermore, the conveyance device of the invention having the above features can provide the following operations and effects.

The invention described in (3) is a conveyance device comprising carriers for mounting workpieces, a conveyer for conveying the carriers, a heating furnace for heating the workpieces while covering a part of the conveyer, and a positioning mechanism for positioning the carriers in the heating furnace, wherein a plurality of heating devices are arranged at predetermined intervals in the heating furnace, each of the carriers includes at least one engagement part, the positioning mechanism comprises a carrier stopper having comb tooth-shaped positioning projections engageable with the engagement parts of the carriers; and a reciprocating mechanism for moving the carrier stopper back and forth with respect to the carriers and engaging the positioning projections with the engagement parts of the carriers.

Accordingly, since the positioning projection is moved forward toward the engagement part of the carrier, the plurality of carriers in the heating furnace can be positioned in place. The comb tooth-shaped positioning projections are positioned in engagement with the engagement parts of the carriers respectively, so that errors of stop positions are not accumulated.

The invention described in (4) further comprises, in the conveyance device (3), a detection sensor for detecting oncoming of the carriers, and a control means for controlling driving of the reciprocating mechanism based on a detection information by the detection sensor.

The engagement part is provided in or near the carrier side surface perpendicular to the carrier conveying direction. This engagement part is engaged with the comb tooth-shaped projections. The position of a pallet can be detected accurately by the detection sensor. The comb tooth-shaped positioning projections can be moved forward at required timing with respect to the engagement part of the pallet and be engaged with the engagement part.

The invention described in (5) is that, in the conveyance device (3) or (4), each carrier includes the engagement parts at a front end and a rear end in the conveying direction of the carrier.

Since the engagement parts are formed at the front end and the rear end of each carrier, the orientation of each carrier in the back and forth direction is not particularly limited. This contributes to prevention of installation mistakes.

The invention described in (6) is that, in one of the conveyance devices (3) to (5), the engagement parts of each carrier are cutout grooves formed in parallel with the carrier conveying direction, each of the cutout grooves is formed wider than a width of each positioning projection, and when each positioning protrusion is inserted in a front area of each cutout groove, the conveyer is moved forward to convey the carriers, the positioning projections are engaged in a rear end of each cutout groove.

Accordingly, since the cutout groove formed as the engagement part in the carrier is designed to be wider than the width of each positioning projection, the positioning of each carrier by the positioning projections can be easily conducted.

BRIEF DESCRIPTION OF DRAWINGS

FIG. 6A is a side sectional view of a jig to be placed on a mount section in the embodiment;
FIG. 6B is a top view of the jig to be placed on the mount section in the embodiment.

REFERENCE SIGNS LIST

Figure 1:
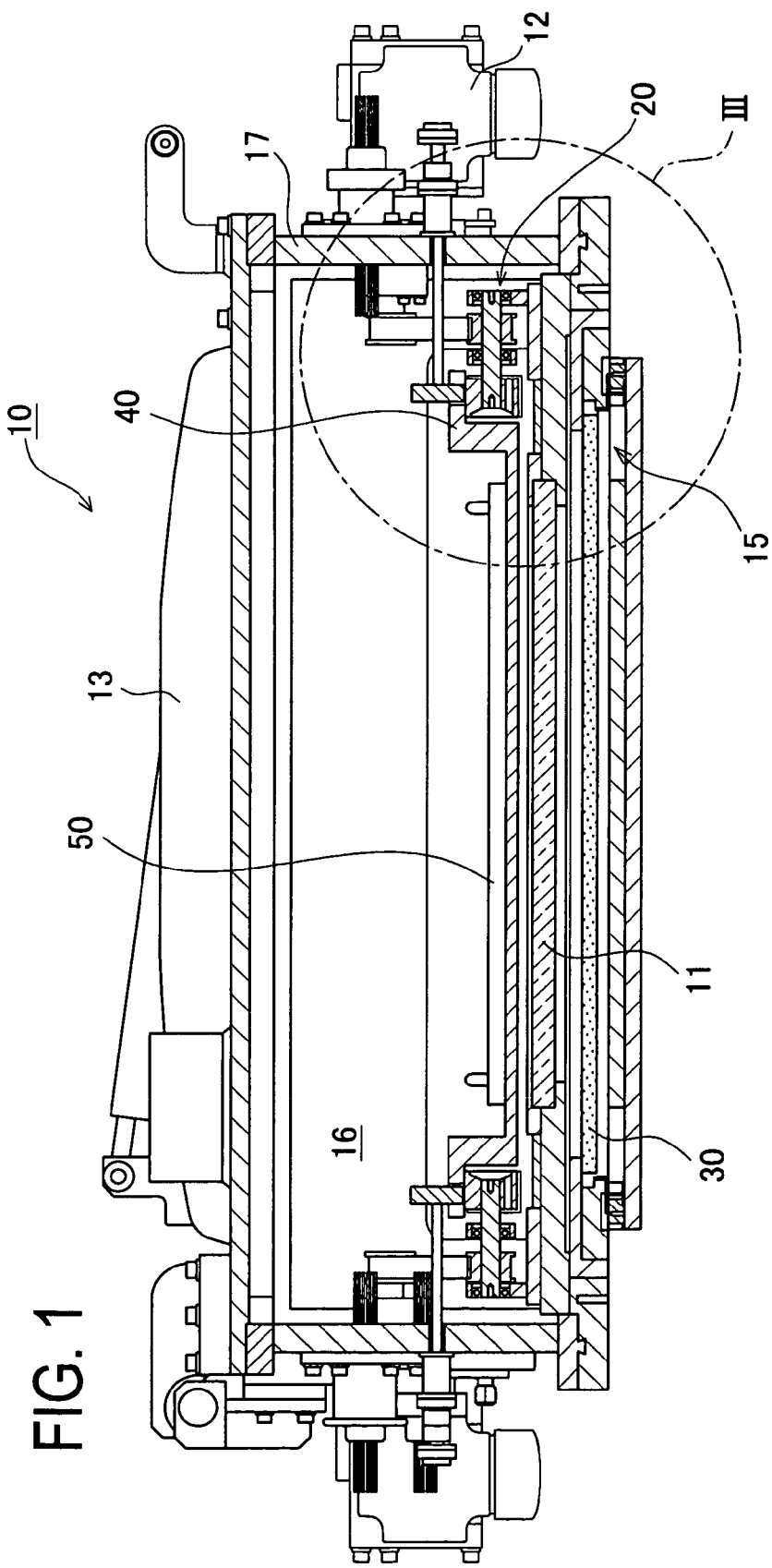
FIG. 1 is a cross sectional view of a conveyance device in an embodiment.

10 Conveyance device
13 Heating furnace
11 Quartz glass plate
30 Halogen heater
35 Carrier stopper
35a Stopper projection
36 Stopper shaft
37 Cylinder
38 Shaft guide
40 Carrier pallet
41 Projection
42 Cutout groove
43 Heat-insulating member
44 Positioning pin
45 Detection sensor
50 Inverter component
50a Mount section
51 Element
52 Solder foil
53 Aluminum pattern
54 Insulating substrate
55 Brazing material
56 Jig

DESCRIPTION OF EMBODIMENTS

A detailed description of a preferred embodiment of the present invention will now be given referring to the accompanying drawings.

Figure 2:
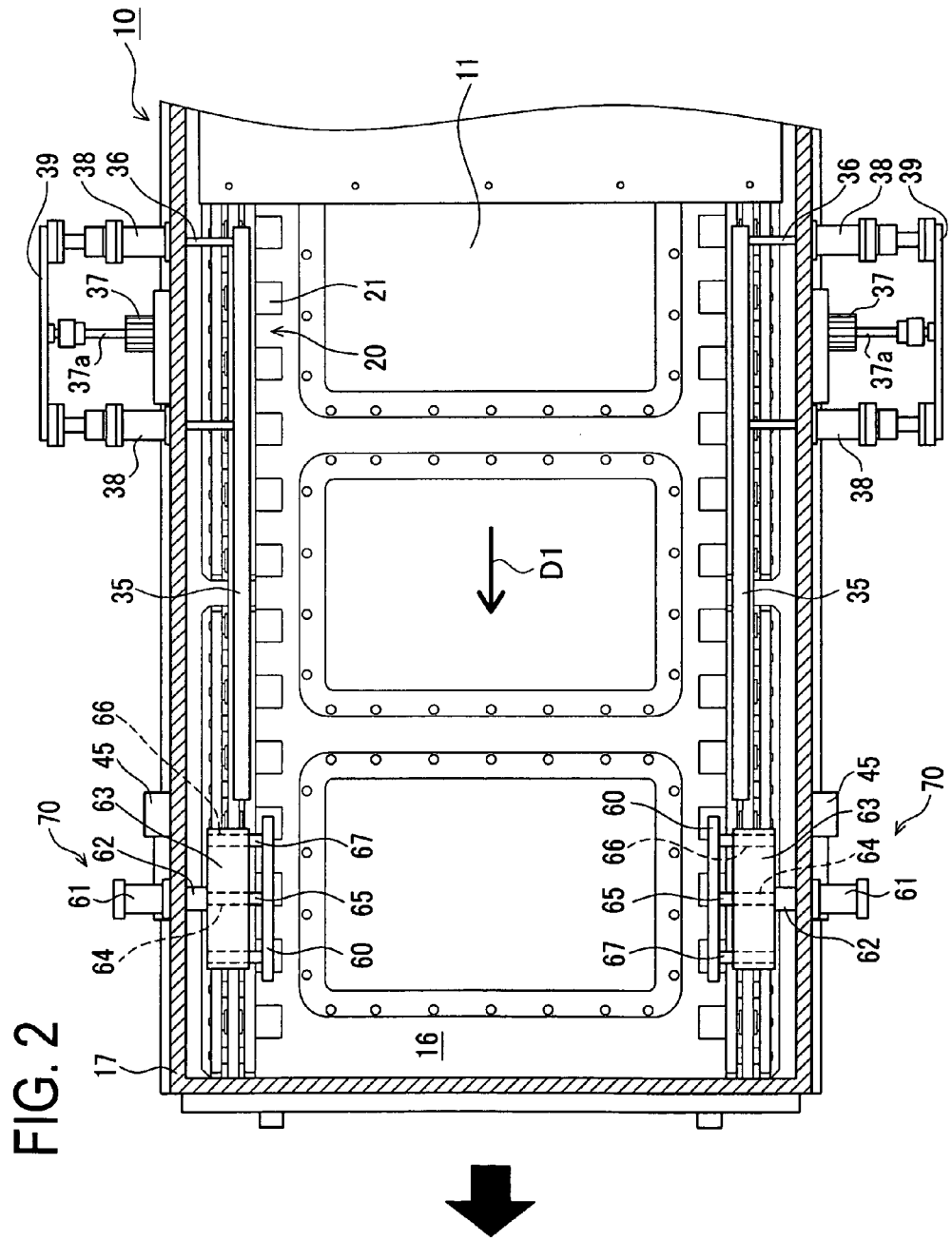
FIG. 2 is a plan view of the inside of the conveyance device in the embodiment.
Figure 3:
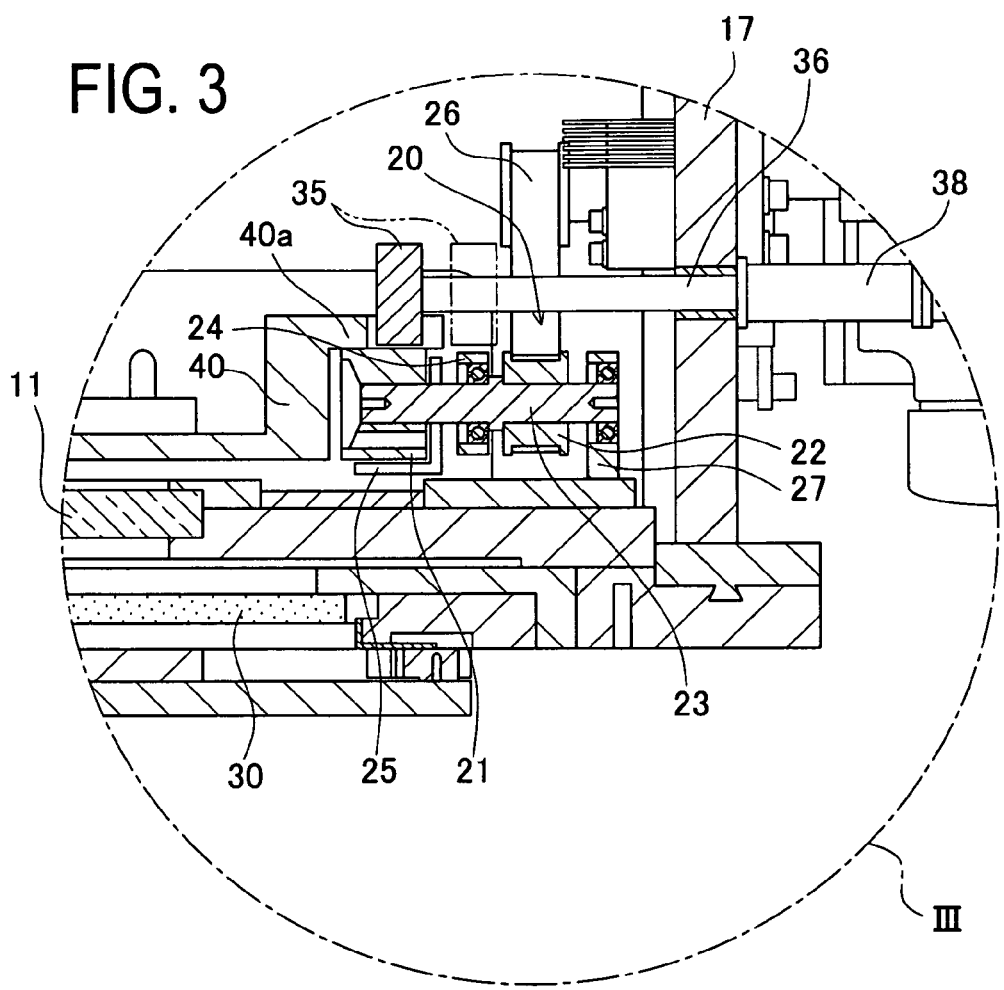
FIG. 3 is an enlarged view of a conveyer in the embodiment.

FIG. 1 is a cross sectional view of a conveyance device 10 in this embodiment. FIG. 2 is a plan view of the inside of the conveyance device 10. FIG. 3 is an enlarged view of a conveyer 20.

The conveyance device 10 includes a heating furnace 13, the conveyer 20, and a positioning mechanism.

The heating furnace 13 is mainly comprised of a chamber 17 serving as a furnace body and a halogen heater 30 serving as a heating device. The inside of the chamber 17 is partitioned by a quartz glass plate 11 into upper and lower sections, i.e., a heating chamber 16 above the quartz glass plate 11 and a decompression chamber 15 under the quartz glass plate 11. In this decompression chamber 15, the halogen heater 30 is fixedly placed. In the heating chamber 16, an inert gas atmosphere such as nitrogen gas is generated.

The halogen heater 30 serving as a heating device is a commonly used heater including a quartz glass tube filled with halogen gas and internally provided with a tungsten filament. The halogen heater 30 is configured to irradiate infrared light to a workpiece, thereby heating it. The workpiece to be heated in the heating furnace 13 is an inverter component 50. When heated, soldering of the inverter component 50 is performed.

The halogen heater 30 is fixed in the decompression chamber 15 provided in the lower section of the heating furnace 13 and isolated by the quartz glass plate 11.

Isolating the halogen heater 30 from the conveyer 20 is made to prevent dust or other foreign matters from entering the halogen heater 30. Furthermore, it is preferable to fill inert gas such as nitrogen in the decompression chamber 15 to thereby prevent the halogen heater 30 from deteriorating.

The chamber 17 of the heating furnace 13 is formed with a carrier pallet entrance on an upstream side in a workpiece conveying direction and a carrier pallet exit on a downstream side in the workpiece conveying direction. In a lower part of the heating chamber 16 in the chamber 17, the conveyers 20 arranged in two, right and left lines and extended between the carrier pallet entrance and the carrier pallet exit along the workpiece conveying direction.

Each of the conveyers 20 placed in the chamber 17 of the heating furnace 13 is a so-called roller conveyer including a plurality of rollers 21 arranged in a carrier conveying direction.

Each carrier pallet 40 includes supported portions 40a formed on both ends in a direction perpendicular to the carrier conveying direction D1 in FIG. 2. One supported portion 40a is shown in FIG. 3. This supported portion 40a of the carrier pallet 40 is placed on and supported by the rollers 21. By rotation of the rollers 21, each carrier pallet 40 is moved forward. The carrier conveying direction D1 is the same as the above workpiece conveying direction.

In the heating furnace 13, the rollers 21 are arranged in two symmetrical rows, one on each side of the heating furnace 13. The rollers 21 of each conveyer 20 are located in a position away from the quartz glass plate 11 as shown in FIGS. 1 and 3.

In the heating furnace 13, six stop positions of the carrier pallets 40 are provided and also the halogen heaters 30 are placed in six positions. Accordingly, the inverter components 50 are allowed to be treated by six at a time. This number of inverter components 50 to be treated depends on a balance between the size of the heating furnace 13 and the size of each inverter component 50 or other conditions and therefore may be increased or decreased. However, the heating treatment itself takes several minutes. It is accordingly more preferable to treat more components at a time to shorten a treatment time.

Each roller 21 is fixed to one end of a rotation shaft 23. Each roller 21 is made of stainless steel having less carbon content, such as SUS 304, in view of hydrogen brittleness and others.

Each rotation shaft 23 is rotatably supported by bearings provided in a partition wall 24 and a support wall 27. A drive pulley 22 is provided around each rotation shaft 23 between the partition wall 24 and the support wall 27.

Each pulley 22 mounted on each rotation shaft 23 is located outside each roller 21 (on the side opposite from the quartz glass plate 11). This is because a belt 26 extended over the pulleys 22 is made of resin and poor in heat resistance. A compact inside of the heating furnace 13 is preferable in view of heat efficiency, while the pulleys 22 and the belt 26 are desired to be placed as outermost as possible.

Each pulley 22 transmits the rotation of a motor 12 externally attached to the heating furnace 13 through the belt 26 to each rotation shaft 23. Accordingly, rotation of the pulley 22 causes the roller 21 fixed to the rotation shaft 23 to rotate.

Figure 4:
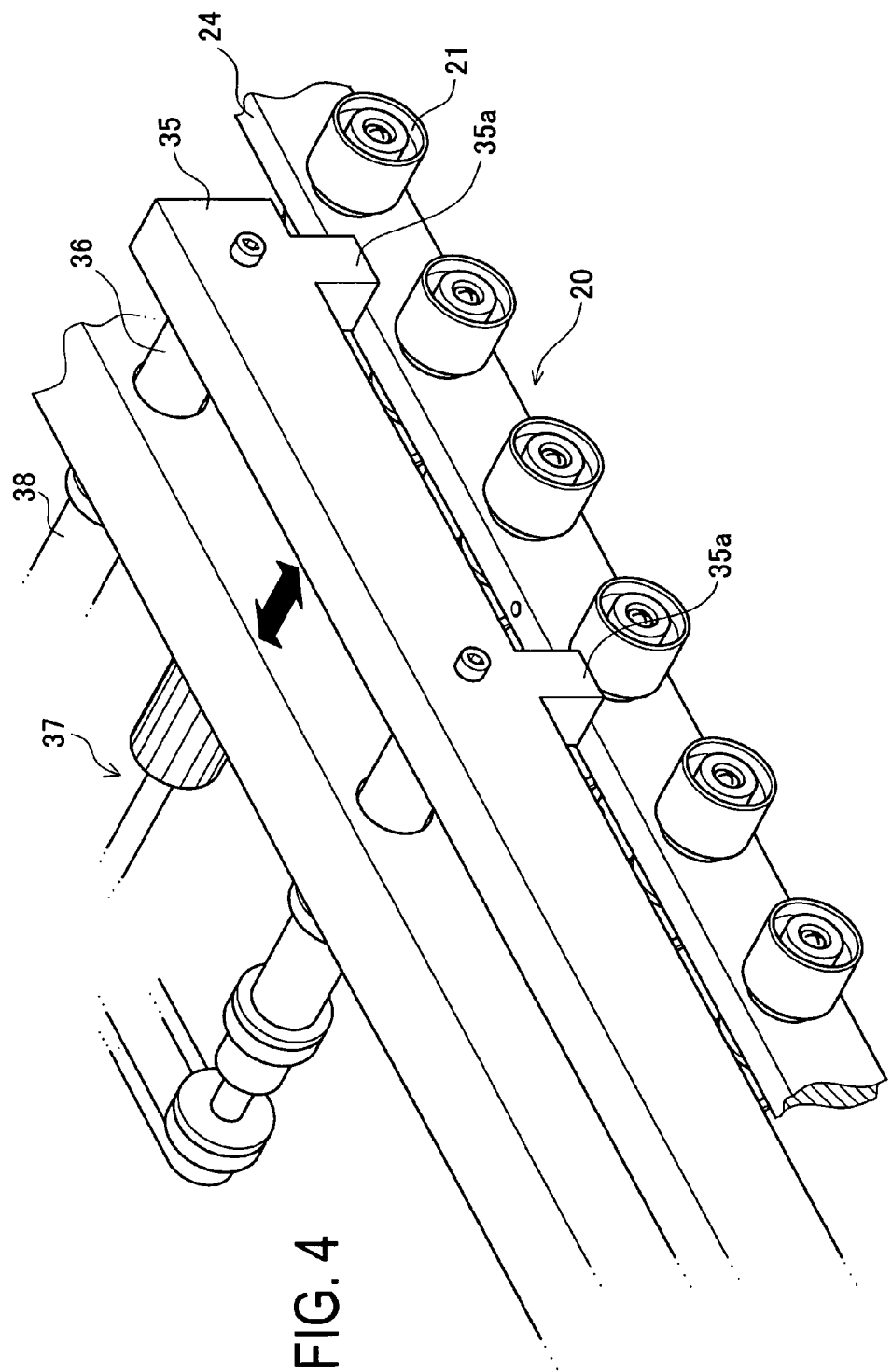
FIG. 4 is a perspective view of the conveyer in the embodiment.

FIG. 4 is a perspective view of the conveyer 20.

A carrier stopper 35 is arranged adjacent to the conveyer 20 so that a lower end of the carrier stopper 35 (which will abut on a positioning projection mentioned later) is located at almost the same level as a carrying surface of the conveyer 20. Each carrier stopper 35 is connected to one ends of a pair of stopper shafts 36 arranged in parallel, serving as a reciprocating mechanism, as shown in FIG. 2. Those stopper shafts 36 are provided passing through the chamber 17 of the heating furnace 13.

The other end of each stopper shaft 36 is held by a shaft guide 38 serving as a linear-motion guide. A cylinder 37 is placed between two shaft guides 38. A leading end of a piston rod 37a of the cylinder 37 is connected to a coupling member 39 to which the shaft guides 38 are connected.

In synchronization with expansion and contraction of the piston rod 37a caused by operation of the cylinder 37, the pair of the stopper shafts 36 are linearly moved back and forth with respect to the carrier pallets 40.

Such configured reciprocating mechanism is preferably provided at the side of the carrier stopper 35 but may be provided above the carrier stopper 35. In the case where the aforementioned halogen heaters 30 are placed in the upper section of the heating furnace 13, the reciprocating mechanism may be under the carrier stopper 35. Even though omitted from the figures, the carrier stoppers 35 are provided two in each of right and left places in the heating furnace 13, that is, in total four places in the heating furnace 13.

The stopper shafts 36 are linearly moved while being held by the shaft guides 38, so that each carrier stopper 35 is allowed to move in a direction perpendicular to the conveying direction of the carrier pallets 40.

Each carrier stopper 35 is formed with a plurality of comb tooth-shaped stopper projections 35a arranged in a longitudinal direction and protruding toward the rollers 21. The stopper projections 35a engage with a cutout groove 42 (mentioned later) of each carrier pallet 40.

An interval between the comb tooth-shaped stopper projections 35a of the carrier stopper 35 is preferably determined to be sufficiently wider than the width of the carrier pallet 40.

For example, if the width of the carrier pallet 40 in the conveying direction is about 120 mm, the interval between the stopper projections 35a is set to about 125 mm so that the carrier pallet 40 is stopped at constant intervals on the conveyer 20 when the carrier pallet 40 engages with the carrier stopper 35 to position the carrier pallet 40.

A temporary stopper 60 is a stopper for stopping the carrier pallet 40 movable in combination with the carrier stopper 35.

Figure 5:
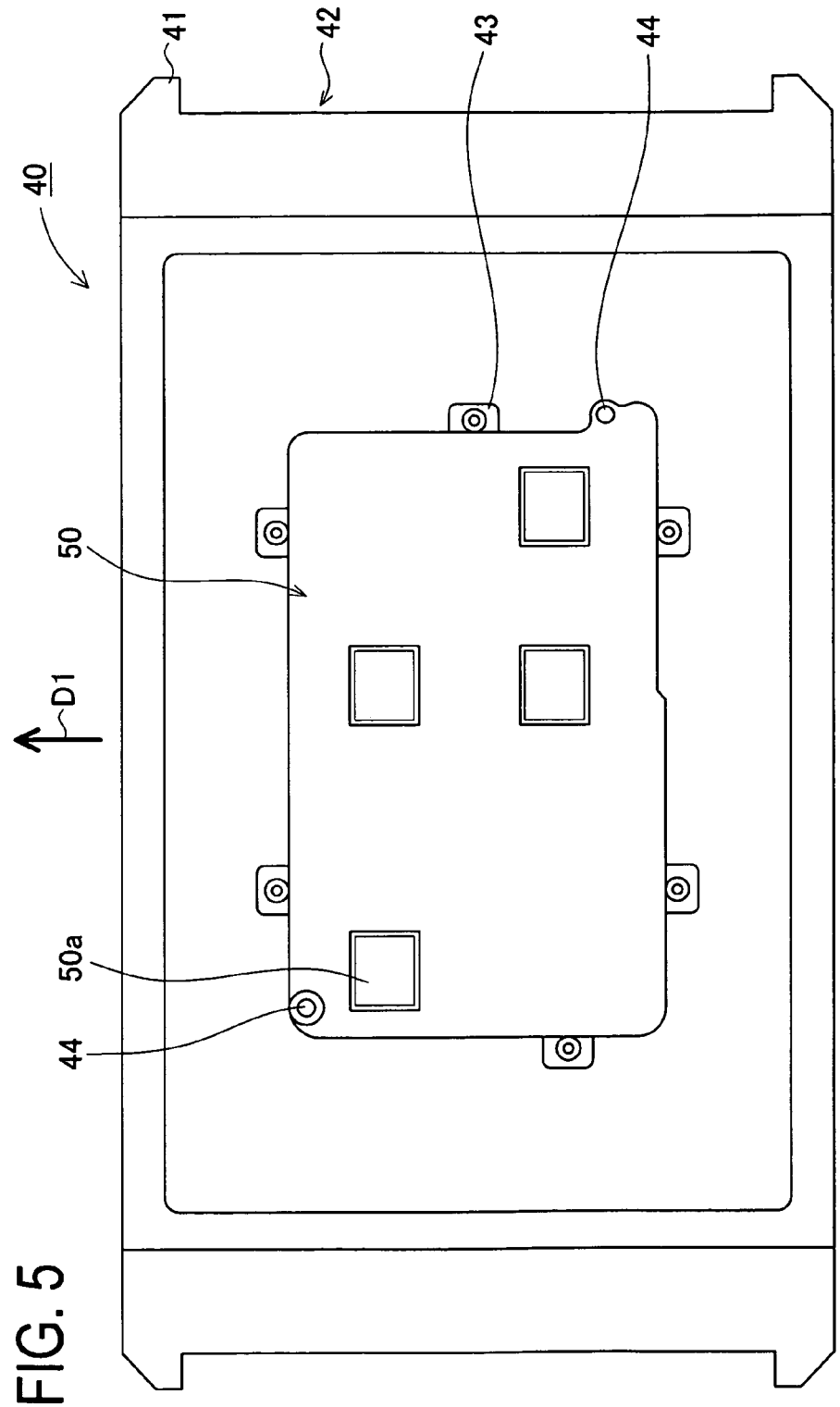
FIG. 5 is a plan view of a carrier pallet in the embodiment.

FIG. 5 is a plan view of the carrier pallet 40.

The carrier pallet 40 is formed with two cutout grooves 42 each defined by a pair of projections 41 serving as an engagement part. These cutout grooves 42 are formed in the carrier pallet 40 (on both sides in the direction perpendicular to the carrier conveying direction D1). The projections 41 are precisely created by machining made for forming the cutout grooves 42. In other words, the projections 41 are provided on both sides of each cutout groove 42 and at front and rear ends in the carrier conveying direction D1.

Each supported portion 40a of the carrier pallet 40 is of a step-like shape upward bent as shown in FIGS. 1 and 3. The supported portion 40a formed on each side of the carrier pallet 40 is formed with the projections 41 and the cutout groove 42. The supported portions 40a are placed on the rollers 21 arranged in two, right and left, rows, respectively.

The carrier pallet 40 may be machined to form the cutout grooves 42 and the projections 41. Alternatively, the carrier pallet 40 may be attached with separate parts forming the projections 41.

In the center of the carrier pallet 40, an inverter component 50 which is a workpiece is set through a heat-insulating member 43. The carrier pallet 40 is provided with positioning pins 44 whereby the inverter component 50 is accurately positioned with respect to the carrier pallet 40. Preferably, a temporary stop mechanism is preferably provided in front of each positioning mechanism in the carrier conveying direction D1 to temporarily stop the carrier pallet 40. The temporary stop mechanism includes a set of temporary stop devices 70 each configured as below.

A temporary stop cylinder 61 is attached to the chamber 17 so that a stopper drive shaft 62 serving as an output shaft of the cylinder 61 extends through the chamber 17. Furthermore, a stopper guide case 63 is attached to the partition wall 24 and the support wall 27.

The stopper guide case 63 is centrally formed with a shaft hole 64 through which a drive shaft 65 extends. Guide holes 66 are provided on both sides of the shaft hole 64. Stopper guide shafts 67 are slidably supported in the guide holes 66. A leading end of the drive shaft 65 is connected to the temporary stopper 60 extending in the carrier conveying direction D1.

Both end portions of the temporary stopper 60 are connected with the stopper guide shafts 67 arranged in parallel with the stopper drive shaft 62. The temporary stopper 60 is provided, in at least a rear end portion in the conveying direction, with a projection not shown which engages with the projection 41 of the carrier pallet 40.

Herein, a distance between the projection in the rear end of the temporary stopper 60 in the conveying distance and the carrier stopper 35 is adjusted so that, when the carrier pallets 40 are temporarily stopped by the temporary stopper 60 as mentioned later, the stopper projections 35a of the carrier stopper 35 enter the cutout grooves 42 of the carrier pallets 40.

In the chamber 17, detection sensors 45 mentioned later are provided one each between a position corresponding to the rear end of the temporary stopper 60 and a position corresponding to a front end of the carrier stopper 35 in the conveying direction.

The present embodiment has the aforementioned configuration and therefore provides the operations explained below.

The inverter component 50 set on the carrier pallet 40 is conveyed by the conveyers 20 into the heating furnace 13.

The inverter component 50 is positioned in place on the carrier pallet 40 with the positioning pins 44 through the heat-insulating member 43.

Figure 7B:
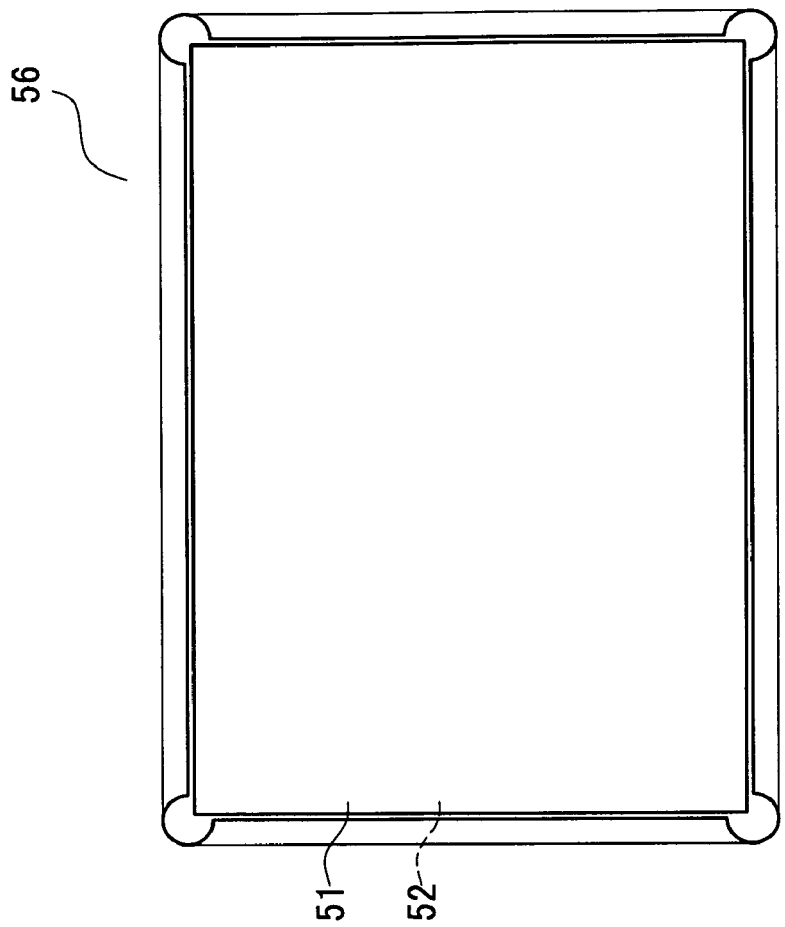
FIG. 7B is a top view of the solder foil and the element to be placed on the mount section in the embodiment.
Figure 7A:
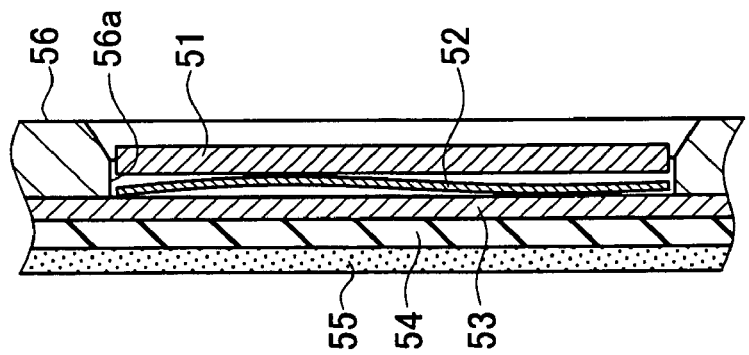
FIG. 7A is a sectional view of a solder foil and an element to be placed on the mount section in the embodiment.

FIGS. 6A and 6B are a side sectional view and a top view of the jig 56 placed on the mount section 50a. FIGS. 7A and 7B are a side view and a top view of a solder foil 52 and an element 51 placed on the mount section 50a.

The inverter component 50 needs to mount the element 51 on the surface thereof and hence is provided with the mount section 50a on which the element 51 is to be placed. Accordingly, the carrier pallet 40 needs to be accurately machined and also the inverter component 50 has to be positioned accurately with respect to the carrier pallet 40.

Therefore, before the inverter component 50 is conveyed into the heating furnace 13, the jig 56 is mounted in the mount section 50a. The jig 56 is a jig made of carbon and formed with a hole 56a in which the element 51 and others are set and an outer frame 56b for positioning the jig 56.

On the upper surface of the mount section 50a formed in the inverter component 50, moreover, an insulating substrate 54 is brazed with brazing material 55. An aluminum pattern 53 is formed on the upper surface of the insulating substrate 54 as shown in FIG. 7A. A bonding technique of the insulating substrate 54 is not particularly limited to brazing and may be any bonding technique such as soldering.

The solder foil 52 and the element 51 are set in the hole 56a of the jig 56 and then the inverter component 50 is conveyed into the heating furnace 13.

When the inverter component 50 fixed on the carrier pallet 40 is conveyed into the heating furnace 13 by use of the conveyers 20, the carrier pallet 40 is positioned in place in the heating furnace 13.

The positioning is performed in the following steps.

Figure 8:
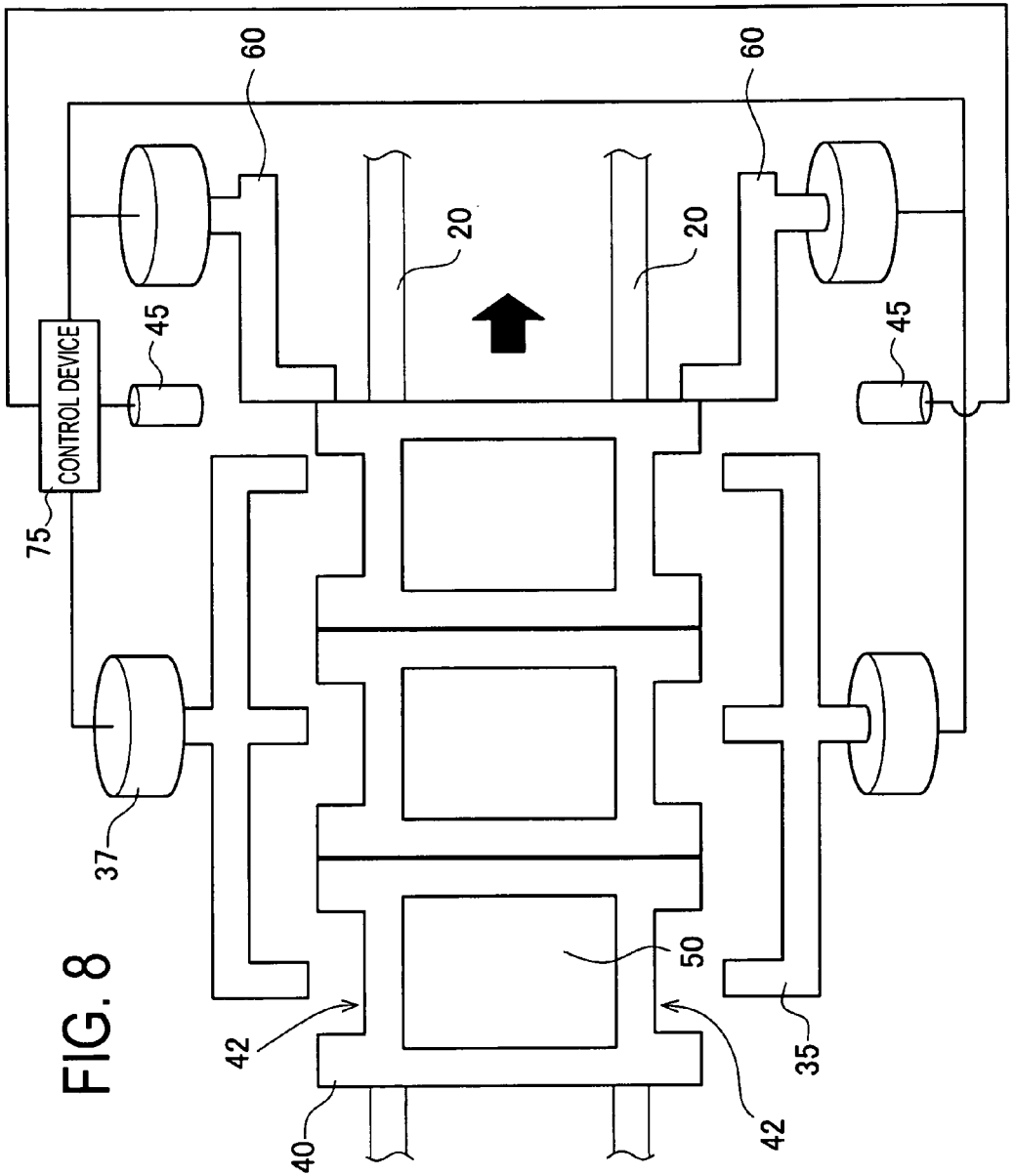
FIG. 8 is an explanatory view showing a first step of positioning carrier pallets in the embodiment.
Figure 9:
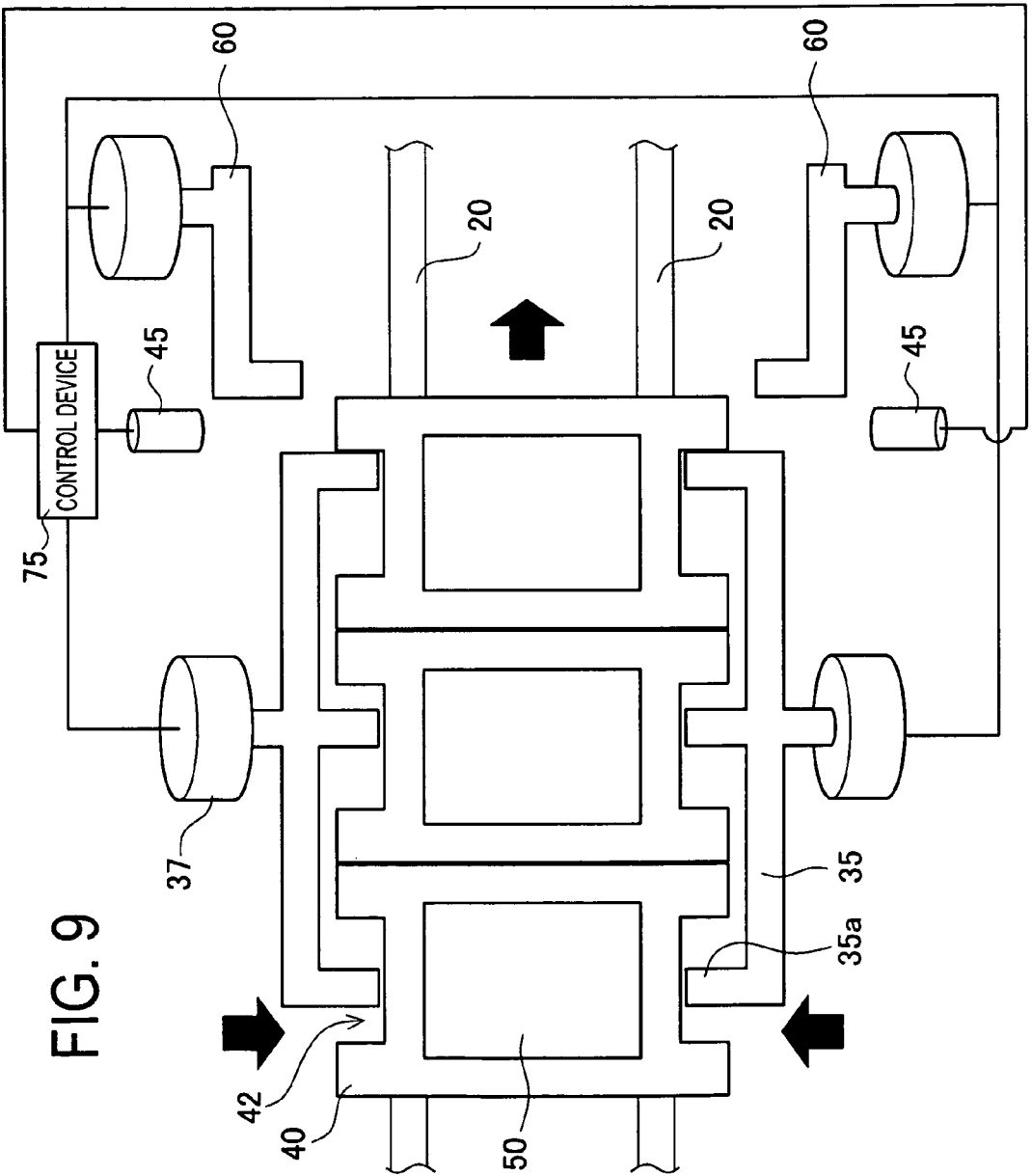
FIG. 9 is an explanatory view showing a second step of positioning the carrier pallets in the embodiment.
Figure 10:
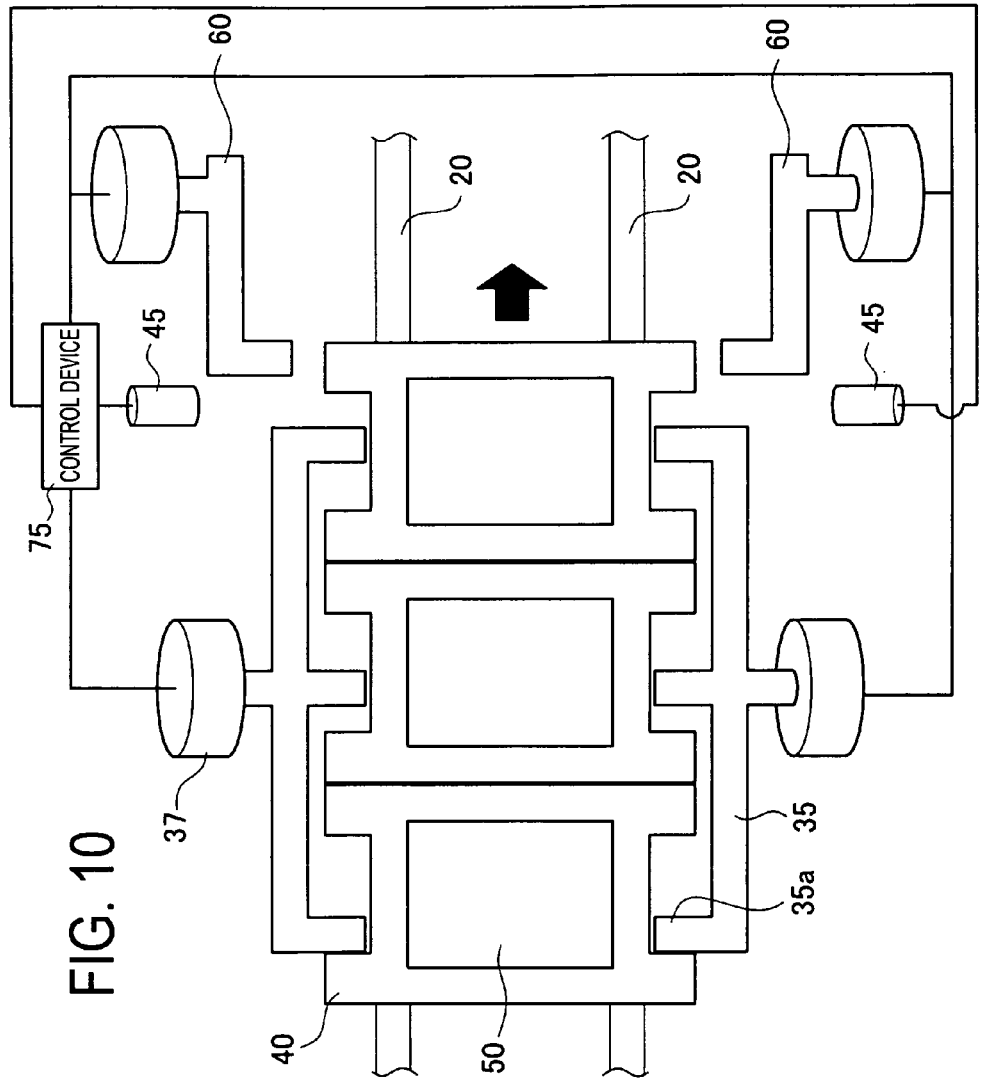
FIG. 10 is an explanatory view showing a third step of positioning the carrier pallets in the embodiment.
Figure 11:
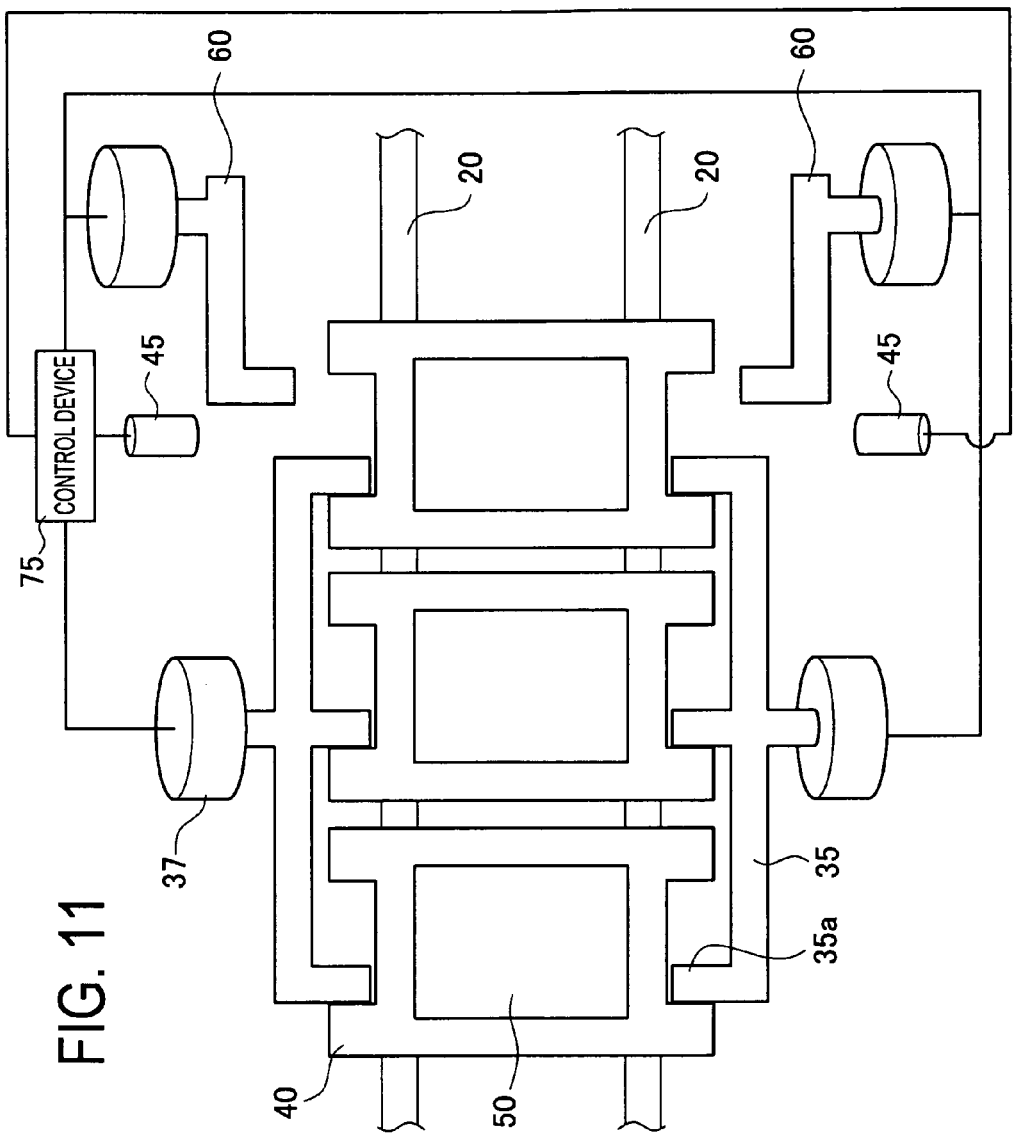
FIG. 11 is an explanatory view showing a fourth step of positioning the carrier pallets in the embodiment.

FIG. 8 is an explanatory view showing a first step of positioning the carrier pallets 40. FIG. 9 shows a second step, FIG. 10 shows a third step, and FIG. 11 shows a fourth step. The conveyers 20 are simplified for convenience of explanation.

For each conveyer 20, the detection sensor 45 is provided to detect the carrier pallet 40. The detection sensor 45 may be of any type, a proximity sensor or a photoelectric tube (a photoelectronic sensor). In this embodiment, the photoelectric tube is adopted.

As a concrete example using the photoelectric tube, there is a method using a laser irradiation device including an irradiation part on one side and a light-sensitive part on the other side in a direction perpendicular to the carrier conveying direction D1. This method is to detect oncoming or passing of the carrier pallet 40 based on whether laser irradiation light is present or not. This detection sensor 45 has to be changed appropriately according to a using environment and an object to be detected.

In the first step, the cylinders 61 placed on both sides of the chamber 17 are first driven to move forward the temporary stoppers 60 in advance to protrude toward the carrier pallet 40. Then, the conveyers 20 are driven to convey the carrier pallets 40. When the detection sensors 45 serving as stop sensors detect the carrier pallet 40, a control device 75 determines the oncoming of the carrier pallet 40.

After determining the oncoming of the carrier pallet 40, the control device 75 stops the driving of the conveyers 20. At that time, the front projections 41 of the carrier pallet 40 abut on the rear projections of the temporary stoppers 60 and the carrier pallets 40 are thus temporarily stopped.

Moreover, a speed-reduction sensor may be placed upstream from the detection sensor 45 in the conveying direction so that a conveying speed of the conveyers 20 is decreased when the speed-reduction sensor detects the oncoming of the carrier pallet 40. This makes it possible to temporarily stop the carrier pallets 40 more reliably by the projections of the temporary stoppers 60.

In the second step, the cylinders 61 of the temporary stop mechanism are driven again to retract the temporary stoppers 60 and simultaneously the cylinders 37 are respectively driven to move forward both the carrier stoppers 35 toward the carrier pallets 40. The carrier stoppers 35 equal in configuration to each other are provided in each side of the heating furnace 13. The carrier stoppers 35 are moved forward at the same time by the control device 75 in synchronization with the driving of the cylinders 37.

By forward movement of the carrier stoppers 35, the stopper projections 35a enter the cutout grooves 42 of the carrier pallets 40. In this way, the carrier pallets 40 are temporarily stopped and then the carrier stoppers 35 are moved forward, so that the stopper projections 35a are allowed to reliably enter the cutout grooves 42 of the carrier pallet 40.

Even though omitted from FIGS. 8 to 11, the carrier stoppers 35 are placed in two pairs, i.e., four stoppers. All the carrier stoppers 35 are operated in sync with one another. The temporary stoppers 60 are retracted in sync with operation of the carrier stoppers 35.

In the third step, the conveyers 20 are activated to rotate the rollers 21 again, thereby conveying the carrier pallets 40 in the carrier conveying direction D1. The carrier pallets 40 abut on the stopper projections 35a of the carrier stoppers 35 in the order in which the carrier pallets 40 are arranged on an upstream side in the conveying direction, and thus the carrier pallets 40 are stopped in turn.

After all the carrier pallets 40 are positioned by the carrier stoppers 35, the driving of the conveyers 20 are stopped and heating of the halogen heaters 30 are started in the fourth step.

When the inverter components 50 are heated by the halogen heaters 30, the solder foils 52 set on the inverter components 50 are fused.

The positioning by the carrier stoppers 35 is then released. The inverter components 50 fixed on the carrier pallets 40 are conveyed by the conveyers 20 out of the heating furnace 13. The solder foils 52 are solidified and the elements 51 are thus soldered on the inverter components 50.

The present embodiment having the above configurations and operations can provide the effects mentioned below.

A first effect is that errors of stop positions of the carrier pallets 40 are not accumulated.

Specifically, the conveyance section positioning method comprises the carrier pallets 40 each mounting the inverter components 50, the conveyers 20 for conveying the carrier pallets 40, the heating furnace 13 covering a part of the conveyers 20 from above and configured to heat the inverter components 50, and the positioning mechanism for positioning the carrier pallets 40 in the heating furnace 13. The method is to stop the carrier pallets 40 conveyed by the conveyers 20 at predetermined positions by the positioning mechanism. The heating furnace 13 includes a plurality of the halogen heaters 30 for heating the inverter components 50. Each carrier pallet 40 is provided with the projections 41 and the cutout grooves 42. Each carrier stopper 35 includes the comb tooth-shaped stopper projections 35a configured to be engageable with the plurality of the projections 41 and arranged at wider intervals than the width of each carrier pallet 40 in the conveying direction. Each carrier stopper 35 is moved forward to engage the stopper projections 35a with the projections 41 to thereby position the carrier pallets 40 at a time in places corresponding to the halogen heaters 30.

The carrier pallets 40 for carrying the inverter components 50 into the heating furnace 13 are often made of a metallic material to satisfy a demand for heat resistance. The use of ceramics or the like can provide heat resistance with more reliability but it is weak against impact. The metallic material is therefore more preferable.

In this embodiment, each carrier pallet 40 made of aluminum is heated to almost 400° C. in order to melt the solder foil 52. Each carrier pallet 40 is apt to expand by about several millimeters accordingly.

In the heating furnace 13 in which six inverter components 50 are treated, when the positions of the carrier pallets 40 are determined by the positioning of a foremost one, stop positions of subsequent carrier pallets 40 gradually deviate and consequently infrared light from the halogen heaters 30 may not evenly impinge on the inverter components 50.

In this embodiment, however, the carrier stoppers 35 includes the comb tooth-shaped stopper projections 35*a* whereby the carrier pallets 40 are allowed to be positioned at a time. This configuration can minimize the influence of expansion of each carrier pallet 40.

Figure 12:
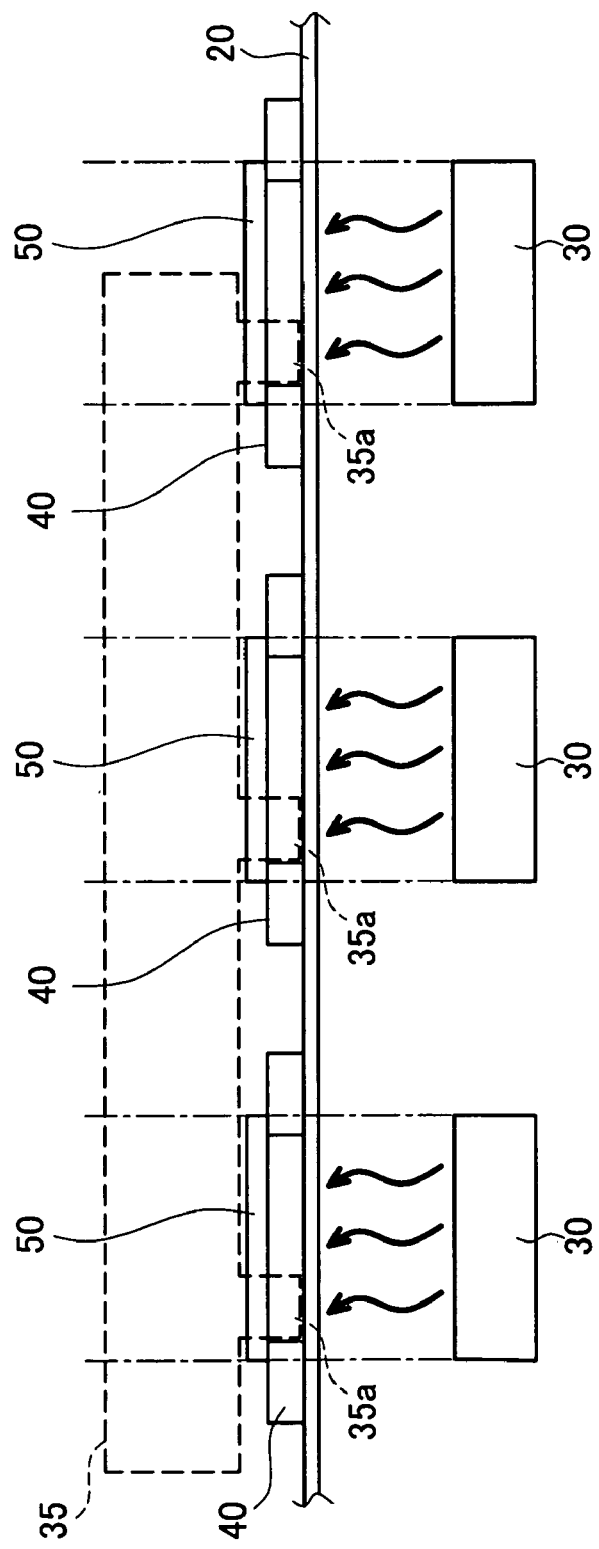
FIG. 12 is a side view showing a state where the carrier pallets are positioned by a carrier stopper.

FIG. 12 is a side view showing a relationship between the carrier pallets 40 positioned in place and the halogen heaters 30.

As the number of the carrier pallets 40 stopped in the heating furnace 13 is increased, the stop positions are more likely to be affected by thermal expansion of each carrier pallet 40. A thermal coefficient of expansion of aluminum is about $24 \times 10^{-6}$. However, according to the size of each carrier pallet 40, the deviation resulting from accumulation of the errors may have a large influence.

In the case where the inverter component 50 is to be heated by irradiation of infrared light from the halogen heater 30, the temperature of a portion not exposed to the infrared light is increased by heat transfer through the inverter component 50. That is, the temperature of a portion exposed to the infrared light is increased faster. This may cause a temperature gradient in the inverter component 50.

An excessive temperature rise is not preferable in view of heat resistance of the element 51. On the other hand, the temperature is desired to uniformly increase in a short period of time to a minimum temperature needed to melt the solder foil 52. Such temperature gradient is not preferable.

Consequently, as shown in FIG. 12, since each carrier stopper 35 is formed with the comb tooth-shaped stopper projections 35*a* engageable with the carrier pallets 40 and arranged at the intervals wider than the width of each carrier pallet 40 in the conveying direction, the carrier pallets 40 are positioned at constant intervals on the conveyers 20. This can minimize the influence of expansion due to the temperature.

Specifically, the positions of the carrier pallets 40 are determined by contact portions of the projections 41 and the stopper projections 35*a*. Even if each carrier pallet 40 expands, accordingly, the position thereof is apt to deviate about the contact portions of the projections 41 and the stopper projections 35*a*. This portion exists inside each carrier pallet 40 and therefore is more unlikely to be influenced by expansion.

Furthermore, the carrier stoppers 35 can stop the plurality of carrier pallets 40 at a time, needing less drive mechanisms and having a high advantage in cost.

Addition of a plurality of drive mechanisms would cause complexity in synchronization control and also a complicated structure of the heating furnace. It is therefore preferable to stop the plurality of the carrier pallets 40 at a time by the carrier stoppers 35.

A second effect is to facilitate positioning of carrier pallets 40.

The cutout grooves 42 of each carrier pallet 40 are formed in parallel with the conveying direction of each carrier pallet 40. Each cutout groove 42 is a groove wider than the width of each stopper projection 35*a*. When each stopper projection 35*a* is inserted in a front area of each cutout groove 42 and the conveyers 20 are moved forward to convey the carrier pallets 40, each stopper projection 35*a* comes to engage with each projection 41 in a rear end area of the cutout groove 42.

Each cutout groove 42 provided as an engagement part of each carrier pallet 40 is formed wider than the width of each positioning projection, so that each carrier pallet 40 can be easily positioned by each stopper projection 35*a*.

Since the width of each cutout groove 42 is sufficiently wider than the width of each stopper projection 35*a*, each carrier pallet 40 can be positioned in a predetermined place even if the position of each carrier pallet 40 deviates during conveyance by the conveyers 20.

Each carrier pallet 40 conveyed by the conveyers 20 is transported by contact with the rollers 21 of the conveyers 20. Friction between each roller 21 and each carrier pallet 40 transmits the rotating force of each roller 21 to each carrier pallet 40. If a larger force than this rotating force is exerted in an opposite direction, the carrier pallet 40 may slip and does not move forward.

For instance, if the carrier pallet 40 first conveyed collides against the carrier pallet 40 next conveyed, a gap may be generated between the carrier pallets 40 by a reactive force.

The carrier pallets 40 are not always conveyed at the same intervals as above. In case the interval between the stopper projections 35*a* of each carrier stopper 35 is shorter than the cutout groove 42 of the carrier pallet 40, the stopper projections 35*a* may not be inserted in the cutout grooves 42.

Furthermore, there is also a case where the carrier pallets 40 are conveyed in almost contact relation on the conveyers 20. In this state, little gap is generated between the carrier pallets 40 conveyed in succession.

However, the carrier pallets 40 positioned by the carrier stoppers 35 are desired to be arranged at predetermined intervals in order to avoid any influence of the aforementioned expansion and others. To ensure such intervals, the width of the cutout groove 42 is preferably determined to be sufficiently wider than the width of the stopper projection 35*a*.

The shapes of each projection 41 and each cutout groove 42 do not always have to be limited to the above shapes in the embodiment. For instance, another configuration may be adopted in which a cutout groove(s) 42 is formed on an upper surface of each carrier pallet 40 and a pin is inserted in the cutout groove 42 from above the carrier pallet 40.

In this case, an insertion pin having a similar configuration to the stopper projection 35*a* of the carrier stopper 35 has only to be embedded in the carrier stopper 35 instead of the stopper projection 35*a*.

The present invention is explained above along the embodiments but not limited thereto. The present invention may be embodied in other specific forms without departing from the essential characteristics thereof.

For instance, each carrier stopper 35 may be arranged to come close to each conveyer 20 from above or to protrude from each conveyer 20 side.

The shape of each carrier pallet 40 may be changed to meet other workpieces than the inverter component 50.

The configuration of the conveying device 10, the shape of the conveyers 20, and the conveying method may be changed.

The invention claimed is:

1. A method of positioning a conveyance section comprising carriers for mounting workpieces, a conveyer for conveying the carriers, a heating furnace for heating the workpieces while covering a part of the conveyer, and a positioning mechanism for positioning the carriers in the heating furnace, the method comprising positioning the carriers conveyed by the conveyer in predetermined places by the positioning mechanism to heat the workpieces, wherein the heating furnace includes heating devices for heating the workpieces that are arranged at predetermined intervals, each of the carriers is provided with an engagement part, the positioning mechanism includes a plurality of positioning projections formed in a comb tooth-shape engageable with the engagement part, and the positioning projections of the positioning mechanism are moved forward in a direction perpendicular to a conveying direction of the carriers to engage with the engagement part to position the carriers at a time in positions facing the heating devices respectively.

2. The method of positioning a conveyance section according to claim 1, wherein the engagement part of the carriers is a cutout groove formed in parallel with the conveying direction of the carriers, the cutout groove being wider than a width of each of the positioning projections, and when each of the positioning projections is inserted in a front area of the cutout groove and the conveyer is moved forward to convey the carriers, each of the positioning projections is engaged in a rear end of the cutout groove.

3. A conveyance device comprising:

carriers for mounting workpieces:

a conveyer for conveying the carriers:

a heating furnace for heating the workpieces while covering a part of the conveyer:

a positioning mechanism for positioning the carriers in the heating furnace, wherein a plurality of heating devices are arranged at predetermined intervals in the heating furnace, each of the carriers includes at least one engagement part, the positioning mechanism comprises a carrier stopper having comb tooth-shaped positioning projections engageable with the at least one engagement part of the carriers; and a reciprocating mechanism for moving the carrier stopper back and forth in a direction perpendicular to a conveying direction of the carriers and engaging the positioning projections with the at least one engagement part of the carriers.

4. The conveyance device according to claim 3, further comprising a detection sensor for detecting oncoming of the carriers, and a control means for controlling driving of the reciprocating mechanism based on a detection information detected by the detection sensor.

5. The conveyance device according to claim 3, wherein each of the carriers further includes the at least one engagement part at a front end and a rear end in the conveying direction of the carriers.

6. The conveyance device according to claim 3, wherein the at least one engagement part of each of the carriers is a cutout groove formed in parallel with the conveying direction of the carriers, the cutout groove being formed wider than a width of each of the positioning projections, and when each of the positioning projections is inserted in a front area of the cutout groove, the conveyer is moved forward to convey the carriers, the positioning projections being engaged in a rear end of the cutout groove.

7. The conveyance device according to claim 4, wherein each of the carriers includes the at least one engagement part at a front end and a rear end in the conveying direction of the carriers.

8. The conveyance device according to claim 4, wherein the at least one engagement part of each of the carriers is a cutout groove formed in parallel with the conveying direction of the carriers, the cutout groove being formed wider than a width of each of the positioning projections, and when each of the positioning projections is inserted in a front area of the cutout groove, the conveyer is moved forward to convey the carriers, the positioning projections being engaged in a rear end of the cutout groove.

9. The conveyance device according to claim 5, wherein the at least one engagement part of each of the carriers is a cutout groove formed in parallel with the conveying direction of the carriers, the cutout groove being formed wider than a width of each of the positioning projections, and when each of the positioning projections is inserted in a front area of the cutout groove, the conveyer is moved forward to convey the carriers, the positioning projections being engaged in a rear end of the cutout groove.

10. The conveyance device according to claim 7, wherein the at least one engagement part of each of the carriers is a cutout groove formed in parallel with the conveying direction of the carriers, the cutout groove being formed wider than a width of each of the positioning projections, and when each of the positioning projections is inserted in a front area of the cutout groove, the conveyer is moved forward to convey the carriers, the positioning projections being engaged in a rear end of the cutout groove.

* * * * *